(12) United States Patent
Kao et al.

(10) Patent No.: US 10,344,821 B2
(45) Date of Patent: *Jul. 9, 2019

(54) VIBRATION SUPPRESSING APPARATUS AND VIBRATION SUPPRESSING METHOD THEREOF

(71) Applicant: Wistron Corporation, New Taipei (TW)

(72) Inventors: Ming-Chi Kao, New Taipei (TW); Ming-Chih Chen, New Taipei (TW); Po-Cheng Chen, New Taipei (TW); Wen Chieh Hsu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/430,551

(22) Filed: Feb. 13, 2017

(65) Prior Publication Data
US 2017/0152912 A1   Jun. 1, 2017

Related U.S. Application Data

(63) Continuation of application No. 14/077,232, filed on Nov. 12, 2013, now Pat. No. 9,645,588.

(30) Foreign Application Priority Data

Aug. 5, 2013   (TW) .............................. 102127974 A

(51) Int. Cl.
| | | |
|---|---|---|
| G05B 21/00 | (2006.01) | |
| G01M 1/38 | (2006.01) | |
| G05B 13/00 | (2006.01) | |
| G05B 15/00 | (2006.01) | |
| G05D 23/00 | (2006.01) | |
| F16F 15/00 | (2006.01) | |
| G05D 19/02 | (2006.01) | |
| B06B 1/06 | (2006.01) | |
| H01L 41/09 | (2006.01) | |
| H01L 41/113 | (2006.01) | |

(52) U.S. Cl.
CPC .............. *F16F 15/002* (2013.01); *B06B 1/06* (2013.01); *F16F 15/00* (2013.01); *F16F 15/007* (2013.01); *G05D 19/02* (2013.01); *H01L 41/09* (2013.01); *H01L 41/1132* (2013.01)

(58) Field of Classification Search
USPC ......................................................... 700/280
See application file for complete search history.

(56) References Cited

U.S. PATENT DOCUMENTS

| | | | | | |
|---|---|---|---|---|---|
| 4,453,141 | A | * | 6/1984 | Rosati ....................... | H03L 1/00 310/316.01 |
| 8,462,459 | B1 | * | 6/2013 | Lin ..................... | G11B 5/59694 360/75 |
| 2007/0241489 | A1 | * | 10/2007 | Mizushima ............. | F16F 15/03 267/140.14 |

(Continued)

*Primary Examiner* — Mohammad Ali
*Assistant Examiner* — Md Azad
(74) *Attorney, Agent, or Firm* — JCIPRNET

(57) ABSTRACT

A vibration suppressing apparatus and a vibration suppressing method thereof are provided. The vibration amplitude, vibration frequency, and vibration phase of a vibration suppressing unit are adjusted in real-time according to the vibration amplitude, vibration frequency and vibration phase of a vibration source.

18 Claims, 3 Drawing Sheets

(56) References Cited

U.S. PATENT DOCUMENTS

2012/0068574 A1\* 3/2012 Wu .................. G10K 11/002
                                                  310/314
2013/0208923 A1\* 8/2013 Suvanto ............. H04R 3/005
                                                  381/122

\* cited by examiner

VIBRATION SUPPRESSING APPARATUS AND VIBRATION SUPPRESSING METHOD THEREOF

CROSS-REFERENCE TO RELATED APPLICATION

This application is a continuation application of and claims the priority benefit of a prior application Ser. No. 14/077,232 filed on Nov. 12, 2013, now pending. The prior application Ser. No. 14/077,232 claims the priority benefit of Taiwan application serial no. 102127974, filed on Aug. 5, 2013. The entirety of each of the above-mentioned patent applications is hereby incorporated by reference herein and made a part of this specification.

FIELD OF THE INVENTION

The invention generally relates to a vibration suppressing apparatus and a vibration suppressing method thereof, and more particularly to a vibration suppressing apparatus and a vibration suppressing method for an electronic device.

DESCRIPTION OF RELATED ART

Since electronic products (e.g., notebook and tablet computers) are developed towards being thin and light, and emphasis has been placed on user comfort, nowadays the issue of a certain vibration source (e.g., vibration from fans, hard disks, speakers, or optical disk drives) causing case vibration and discomfort to the user has been receiving more and more attention. Conventional techniques have relied on passive suppression methods to reduce these types of vibrations, such as by changing the material structure or adding damping buffer mechanisms like foam, springs, and clips. However, the vibration of the electronic product does not typically originate from one type of vibration source, and may vary according to the operational vibration of the machine. Moreover, passive suppression methods cannot adjust the suppression according to the varying states of the vibration, and therefore these methods cannot effectively lower the vibration.

SUMMARY OF THE INVENTION

The invention provides a vibration suppressing apparatus and a vibration suppressing method thereof, capable of effectively reducing the vibration of a vibration source from an electronic device, and thereby enhance the comfort when a user utilizes the electronic device.

A vibration suppressing apparatus is adapted for an electronic device, and includes a sensing unit, a vibration suppressing unit, and a processer. The sensing unit detects a vibration amplitude, a vibration frequency, and a vibration phase of a vibration source of the electronic device. The vibration suppressing unit may be driven to suppress the vibration of the vibration source, and the vibration suppressing unit has a vibration amplitude, a vibration frequency, and a vibration phase. The processer is coupled to the sensing unit and the vibration suppressing unit, and the processer drives the vibration suppressing unit and adjusts the vibration amplitude, the vibration frequency, and the vibration phase of the vibration suppressing unit according to the vibration amplitude, the vibration frequency, and the vibration phase of the vibration source, so as to suppress the vibration of the vibration source.

According to an embodiment of the invention, the processer further determines whether the vibration frequency of the vibration source is the same as the vibration frequency of the vibration suppressing unit, and whether the vibration phase of the vibration source is the inverse of the vibration phase of the vibration suppressing unit. When the vibration frequency and vibration phase of the vibration source are respectively not the same and not the inverse of the vibration frequency and vibration phase of the vibration suppressing unit, the vibration frequency and vibration phase of the vibration suppressing unit are respectively adjusted to be the same as the vibration frequency and inverse from the vibration phase of the vibration source. Moreover, when the vibration frequency of the vibration source is the same as the vibration frequency of the vibration suppressing unit, and the vibration phase of the vibration source is the inverse of the vibration phase of the vibration suppressing unit, then the vibration amplitude of the vibration suppressing unit is increased.

According to an embodiment of the invention, the processer further determines whether the vibration amplitude of the vibration source has decreased. When the vibration amplitude of the vibration source has not decreased, whether the vibration amplitude, the vibration frequency, and the vibration phase of the vibration source are similar to the vibration amplitude, the vibration frequency, and the vibration phase of the vibration suppressing unit is detemined. When the vibration amplitude, the vibration frequency, and the vibration phase of the vibration source are similar to the vibration amplitude, the vibration frequency, and the vibration phase of the vibration suppressing unit, the vibration suppressing unit is disabled for a predetennined time, and whether the vibration of the vibration source originates from the vibration suppressing unit is determined within the predetermined time. When the vibration amplitude, the vibration frequency, and the vibration phase of the vibration source are not similar to the vibration amplitude, the vibration frequency, and the vibration phase of the vibration suppressing unit, the vibration amplitude of the vibration suppressing unit is decreased.

According to an embodiment of the invention, the vibration suppressing apparatus further includes a charge storage unit coupled to the processer, the sensing unit further converting the vibration of the vibration source into an electrical signal. When the processer determines the vibration amplitude of the vibration source is less than a predetermined value, the processer stores an electrical energy generated by the sensing unit converting the vibration of the vibration source into the charge storage unit.

According to an embodiment of the invention, the vibration suppressing apparatus further includes a charge storage unit coupled to the processer, the sensing unit further converting the vibration of the vibration source into an electrical signal. When the processer determines the vibration amplitude of the vibration source has decreased, the processer further determines whether the vibration amplitude of the vibration source is less than a predetermined value according to the electrical signal. When the vibration amplitude of the vibration source is less than the predetermined value, the processer stores an electrical energy generated by the sensing unit converting the vibration of the vibration source into the charge storage unit. When the vibration amplitude of the vibration source is not less than the predetermined value, the vibration amplitude, the vibration frequency, and the vibration phase of the vibration suppressing unit are adjusted according to the vibration amplitude, the vibration frequency, and the vibration phase of the vibration source.

According to an embodiment of the invention, the vibration suppressing apparatus further includes an inverting amplifier and a programmable resistor unit. The inverting amplifier is coupled to the processer. Moreover, the processer outputs a vibration signal to the inverting amplifier according to the vibration of the vibration source, and the inverting amplifier outputs a vibration suppressing signal according to the vibration signal. The programmable resistor unit is coupled to the inverting amplifier and the processer. The programmable resistor unit drives the vibration suppressing unit to suppress the vibration of the vibration source according to the vibration suppressing signal, in which a resistance value of the programmable resistor unit is controlled by the processer.

According to an embodiment of the invention, the sensing unit is disposed on at least one of besides the vibration source and at a location where the body of the user contacts when the user utilizes the electronic device, and the vibration suppressing unit is disposed besides the vibration source or at a location where the body of the user contacts when the user utilizes the electronic device.

A vibration suppressing method of an electronic device is adapted for suppressing a vibration of a vibration source of the electronic device. The method includes the following steps. The vibration amplitude, the vibration frequency, and the vibration phase of the vibration source are detected. According to the vibration amplitude, the vibration frequency, and the vibration phase of the vibration source, the vibration suppressing unit is driven and a vibration amplitude, a vibration frequency, and a vibration phase of the vibration suppressing unit are correspondingly adjusted, so as to suppress the vibration of the vibration source.

According to an embodiment of the invention, the step of adjusting the vibration amplitude, the vibration frequency, and the vibration phase of the vibration suppressing unit according to the vibration amplitude, the vibration frequency, and the vibration phase of the vibration source includes the following steps. Whether the vibration frequency of the vibration source is the same as the vibration frequency of the vibration suppressing unit, and whether the vibration phase of the vibration source is the inverse of the vibration phase of the vibration suppressing unit is determined. When the vibration frequency and the vibration phase of the vibration source are respectively different and not inverse from the vibration frequency and vibration phase of the vibration suppressing unit, the vibration frequency and the vibration phase of the vibration suppressing unit are respectively adjusted to be the same as the vibration frequency and inverse from the vibration phase of the vibration source. When the vibration frequency of the vibration source is the same as the vibration frequency of the vibration suppressing unit, and the vibration phase of the vibration source is the inverse of the vibration phase of the vibration suppressing unit, the vibration amplitude of the vibration suppressing unit is increased.

According to an embodiment of the invention, the vibration suppressing method further includes the following steps. Whether the vibration amplitude of the vibration source has decreased is determined. When the vibration amplitude of the vibration source has not decreased, whether the vibration amplitude, the vibration frequency, and the vibration phase of the vibration source are similar to the vibration amplitude, the vibration frequency, and the vibration phase of the vibration suppressing unit is determined. When the vibration amplitude, the vibration frequency, and the vibration phase of the vibration source are similar to the vibration amplitude, the vibration frequency, and the vibration phase of the vibration suppressing unit, the vibration suppressing unit is disabled for a predetermined time. Moreover, whether the vibration of the vibration source originates from the vibration suppressing unit is determined within the predetermined time. When the vibration amplitude, the vibration frequency, and the vibration phase of the vibration source are not similar to the vibration amplitude, the vibration frequency, and the vibration phase of the vibration suppressing unit, the vibration amplitude of the vibration suppressing unit is decreased.

According to an embodiment of the invention, the vibration suppressing method further includes the following steps. When the vibration amplitude of the vibration source decreased, whether the vibration amplitude of the vibration source is less than a predetermined value is determined. When the vibration amplitude of the vibration source is less than the predetermined value, the vibration of the vibration source is converted into an electrical energy for storage. When the vibration amplitude of the vibration source is not less than the predetermined value, the vibration amplitude, the vibration frequency, and the vibration phase of the vibration suppressing unit are adjusted according to the vibration amplitude, the vibration frequency, and the vibration phase of the vibration source.

According to an embodiment of the invention, the vibration suppressing method further includes the following steps. Whether the vibration amplitude of the vibration source is less than a predetermined value is determined. When the vibration amplitude of the vibration source is less than the predetermined value, the vibration of the vibration source is converted into an electrical energy for storage. When the vibration amplitude of the vibration source is not less than the predetermined value, the vibration amplitude, the vibration frequency, and the vibration phase of the vibration suppressing unit are adjusted according to the vibration amplitude, the vibration frequency, and the vibration phase of the vibration source.

In summary, according to embodiments of the invention, since the vibration amplitude, the vibration frequency, and the vibration phase of the vibration suppressing unit may be adjusted in real-time according to the vibration variation state of the vibration source, therefore, the vibration of the vibration source can be effectively suppressed, and thereby enhance the comfort when the user utilizes the electronic device.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
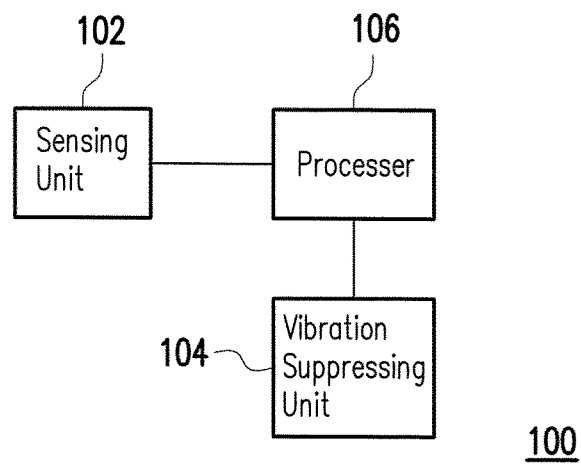
FIG. 1 is a schematic view of a vibration suppressing apparatus according to an embodiment of the invention.

FIG. 1 is a schematic view of a vibration suppressing apparatus according to an embodiment of the invention. A vibration suppressing apparatus 100 may be adapted for an electronic device, such as a notebook computer, a tablet computer, a mobile phone, for example. The vibration suppressing apparatus 100 may include a sensing unit 102, a vibration suppressing unit 104, and a processor 106. The processer 106 is coupled to the sensing unit 102 and the vibration suppressing unit 104. The sensing unit 102 detects a vibration amplitude, a vibration frequency, and a vibration phase of a vibration source of the electronic device. The vibration source of the electronic device may be a fan, a hard disk, a speaker, an optical drive, or other devices which may trigger movement. The sensing unit 102 may be a piezoelectric patch or a gravity sensor, and the vibration suppressing unit may be a piezoelectric patch or a vibration motor, for example. The processer 106 adjusts the vibration amplitude, the vibration frequency, and the vibration phase of the vibration suppressing unit 104 according to the detected vibration amplitude, vibration frequency, and vibration phase of the vibration source.

In detail, the processer 106 may first deteiiiiiine whether the vibration frequency of the vibration source is the same as the vibration frequency of the vibration suppressing unit 104, and whether the vibration phase of the vibration source is the inverse of the vibration phase of the vibration suppressing unit 104. When the vibration frequency of the vibration source is different from the vibration frequency of the vibration suppressing unit 104, and the vibration phase of the vibration source is not the inverse of the vibration phase of the vibration suppressing unit 104, then the processer 106 adjusts the vibration frequency of the vibration suppressing unit 104 to be the same as the vibration frequency of the vibration source, and adjusts the vibration phase of the vibration suppressing unit 104 to be the inverse of the vibration phase of the vibration source. When the vibration frequency and the vibration phase of the vibration source are respectively the same and the inverse of the vibration frequency and the vibration phase of the vibration suppressing unit 104, then the vibration amplitude of the vibration suppressing unit 104 is increased, and the vibration amplitude of the vibration source is decreased. The vibration amplitude of the vibration suppressing unit 104 may be increased by a small increment each time. After increasing the vibration amplitude of the vibration suppressing unit 104 each time, the sensing unit 102 may sense the vibration amplitude, the vibration frequency, and the vibration phase of the vibration suppressing unit 104 again. According to the detection result, the processer 106 may adjust the vibration amplitude, the vibration frequency, and the vibration phase of the vibration suppressing unit 104 again, such that the vibration suppressing apparatus 100 can adjust the vibration state of the vibration suppressing unit 104 dynamically and in real-time according to the variation of the vibration source, and thereby achieve vibration suppression.

When the vibration amplitude of the vibration source has not decreased is determined after the processer 106 adjusts the vibration amplitude, the vibration frequency, and the vibration phase of the vibration suppressing unit 104, the processor 106 may then determine whether the vibration amplitude, the vibration frequency, and the vibration phase of the vibration source are similar to the vibration amplitude, the vibration frequency, and the vibration phase of the vibration suppressing unit 104. When the vibration amplitude, the vibration frequency, and the vibration phase of the vibration source are similar to the vibration amplitude, the vibration frequency, and the vibration phase of the vibration suppressing unit 104, the processor 106 disables the vibration suppressing unit 104 for a predetermined time (e.g. a few milliseconds), and determine whether the vibration of the vibration source originates from the vibration suppressing unit 104.

When the sensing unit 102 detects that the vibration of the vibration source has stopped within the predetermined time that the vibration suppressing unit 104 is disabled, the processor 106 may determine whether the vibration of the vibration source originates from the vibration suppressing unit 104. At this time, the processor 106 may terminate the vibration suppression operation of the vibration suppressing unit 104, until the sensing unit 102 again detects that the vibration source has vibrated, and then the aforementioned vibration suppressing operations are performed.

On the other hand, when the vibration amplitude, the vibration frequency, and the vibration phase of the vibration source is not similar to the vibration amplitude, the vibration frequency, and the vibration phase of the vibration suppressing unit 104, the vibration amplitude of the vibration suppressing unit 104 may be too large, and the processor 106 may decrease the vibration amplitude of the vibration suppressing unit 104, so as to achieve a preferable vibration suppressing effect.

In light of the foregoing, since the vibration amplitude, the vibration frequency, and the vibration phase of the vibration suppressing unit 104 may be dynamically adjusted in real-time according to the vibration variation state of the vibration source, therefore, the vibration suppressing apparatus 100 can effectively suppress the vibration of the vibration source, and thereby enhance the comfort when the user utilizes the electronic device.

It should be noted that, the sensing unit 102 may be disposed on at least one of besides the vibration source and at a location where the body (e.g. hands) of the user contacts when the user utilizes the electronic device (e.g., at a palm rest when the electronic device is a notebook computer for example), so as to sense the vibration state of the vibration source or the vibration state at the location where the body (e.g. hands) of the user contacts when the user utilizes the electronic device. The latter case is substantially equal to the vibration sensation directly felt by the user's hands. The vibration suppressing unit 104 may be disposed besides the vibration source or at a location where the body (e.g. hands) of the user contacts when the user utilizes the electronic device (e.g., at a palm rest when the electronic device is a notebook computer for example), so as to directly suppress the vibration of the vibration source, or to only suppress the vibration at the location where the body (e.g. hands) contacts when the user utilizes the electronic device, and thereby enhancing the user comfort of the electronic device.

Moreover, when the sensing unit 102 detects the vibration of the vibration source, the time point when the detection result is generated may be different from the time point when the vibration of the vibration source occurs. For example, when the sensing unit 102 is implemented by a piezoelectric patch, since the piezoelectric patch requires a set amount of time to convert mechanical energy into electric energy, therefore, the time point when the electrical signals (e.g. voltage or current signals) generated by the sensing unit 102 by converting the vibration of the vibration source is different from the time point when the vibration of the vibration source occurs. The processer 106 may further derive and correct the received vibration amplitude, vibration frequency, and vibration phase of the vibration suppressing unit 104 according to the vibration of the vibration source and the time point when the sensing unit 102 generates the detection result, and thereby more accurately suppress the vibration of the vibration source.

Figure 2:
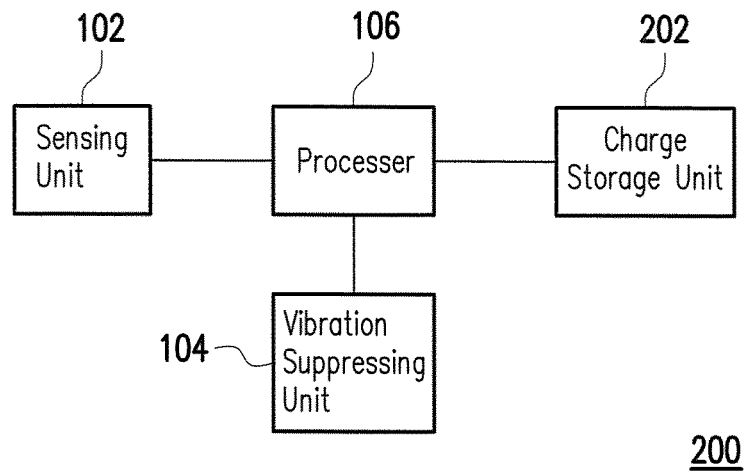
FIG. 2 is a schematic view of a vibration suppressing apparatus according to another embodiment of the invention.

FIG. 2 is a schematic view of a vibration suppressing apparatus according to another embodiment of the invention. As shown in FIG. 2, compared to vibration suppressing apparatus 100, a vibration suppressing apparatus 200 further includes a charge storage unit 202 (e.g. a capacitor) coupled to the processer 106. The sensing unit 102 in the present embodiment may be a piezoelectric patch capable of converting the vibration of the vibration source into an electrical signal, for example. According to the electrical signal, the processer 106 may determine whether the vibration amplitude of the vibration source is less than a predetermined value, in which the predetermined value may be set as a maximum acceptable vibration amplitude when the user utilizes the electronic device. When the vibration amplitude of the vibration source is less than the predetermined value, the processer 106 may store an electrical energy generated by the sensing unit 102 converting the vibration of the vibration source into the charge storage unit 202, so as to increase a power source utilization efficiency of the electronic device. On the other hand, when the vibration amplitude of the vibration source is not less than the predetermined value, then in accordance to the method shown by the embodiment in FIG. 1, the processer 106 adjusts the vibration amplitude, the vibration frequency, and the vibration phase of the vibration suppressing unit 104 according to the vibration amplitude, the vibration frequency, and the vibration phase of the vibration source, so as to suppress the vibration of the vibration source.

Figure 3:
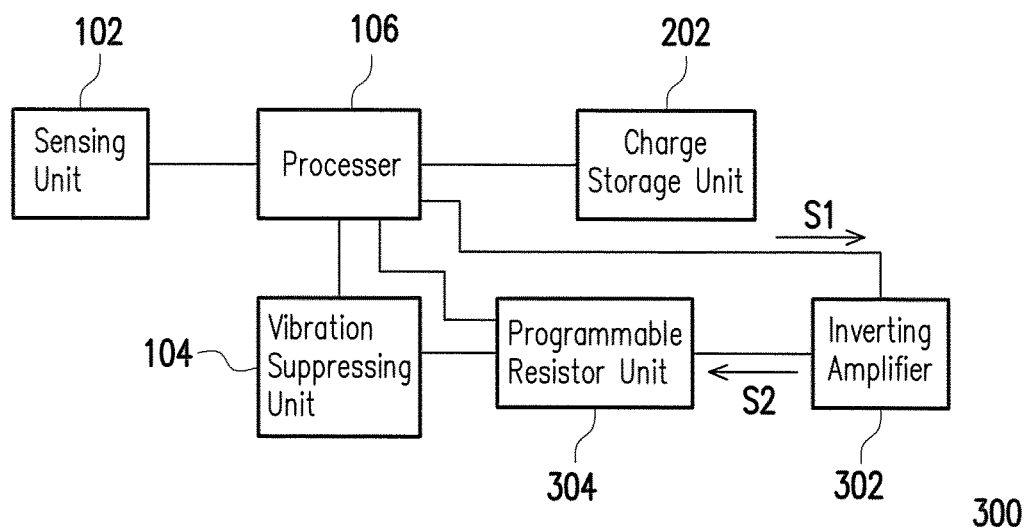
FIG. 3 is a schematic view of a vibration suppressing apparatus according to another embodiment of the invention.

FIG. 3 is a schematic view of a vibration suppressing apparatus according to another embodiment of the invention. The sensing unit 102 and the vibration suppressing unit 104 in the present embodiment are both implemented by piezoelectric patches. Referring to FIG. 3, in specifics, compared to the vibration suppressing apparatus 200, a vibration suppressing apparatus 300 of the present embodiment further includes an inverting amplifier 302 and a programmable resistor unit 304. The inverting amplifier 302 is coupled to the processer 106, and the programmable resistor unit 304 is coupled to the inverting amplifier 302 and the processer 106. The processer 106 may output a vibration signal S1 to the inverting amplifier 302 according to the vibration of the vibration source. The vibration signal S1 may be an electrical signal generated by the sensing unit 102 converting the vibration of the vibration source, for example. The inverting amplifier 302 inverts and amplifies the vibration signal S1, and outputs a vibration suppressing signal S2 to the programmable resistor unit 304. The programmable resistor unit 304 may drive the vibration suppressing unit 104 to suppress the vibration of the vibration source according to the vibration suppressing signal S2. A resistance value of the programmable resistor unit 304 is controlled by the programming unit 106, and therefore the processer 106 may control the vibration characteristics of the vibration suppressing unit 104 by adjusting the resistance value of the programmable resistor unit 304. For example, when the resistance value of the programmable resistor unit 304 increases, a voltage outputted by the programmable resistor unit 304 also increases, thereby causing the vibration amplitude of the vibration suppressing unit 104 to grow.

Figure 4:
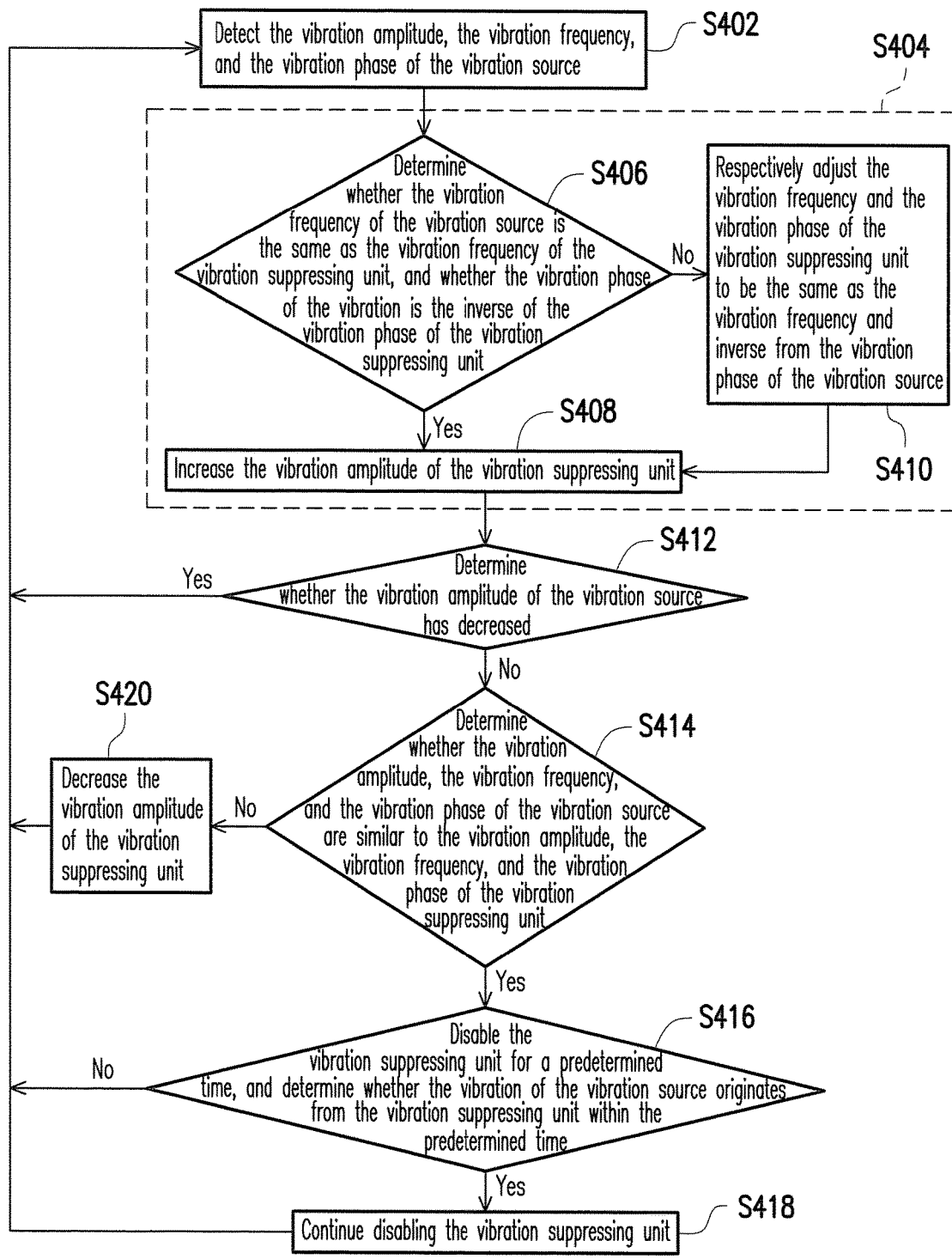
FIG. 4 is a flow diagram illustrating a vibration suppressing method of an electronic device according to an embodiment of the invention.

FIG. 4 is a flow diagram illustrating a vibration suppressing method of an electronic device according to an embodiment of the invention. Referring to FIG. 4, a vibration suppressing method of an electronic device may be generalized to include the following steps. The vibration amplitude, the vibration frequency, and the vibration phase of the vibration source are detected (Step S402). Thereafter, the vibration amplitude, the vibration frequency, and the vibration phase of the vibration suppressing unit are adjusted according to the vibration amplitude, the vibration frequency, and the vibration phase of the vibration source, so as to suppress the vibration of the vibration source (Step S404). In detail, Step S404 may include first determining whether the vibration frequency of the vibration source is the same as the vibration frequency of the vibration suppressing unit, and whether the vibration phase of the vibration source is the inverse of the vibration phase of the vibration suppressing unit (Step S406). When the vibration frequency and the vibration phase of the vibration source are respectively the same and the inverse of the vibration frequency and the vibration phase of the vibration suppressing unit, then the vibration amplitude of the vibration suppressing unit is increased (Step S408). On the other hand, when the vibration frequency and the vibration phase of the vibration source are respectively different and not inverse from the vibration frequency and vibration phase of the vibration suppressing unit, the vibration frequency and the vibration phase of the vibration suppressing unit are respectively adjusted to be the same as the vibration frequency and inverse from the vibration phase of the vibration source (Step S410), and thereafter the process proceeds to Step S408 to increase the vibration amplitude of the vibration suppressing unit. Moreover, the adjustment to the vibration amplitude, the vibration frequency, and the vibration phase of the vibration suppressing unit may be performed in accordance to a timing difference between the vibration of the vibration source and when the detection result is generated.

After adjusting the vibration amplitude, the vibration frequency, and the vibration phase of the vibration suppressing unit, whether the vibration amplitude of the vibration source has decreased is determined (Step S412). When the vibration amplitude of the vibration source has decreased, the vibration characteristics of the vibration suppressing unit may be maintained, and the process returns to Step S402 to continue detecting the vibration amplitude, the vibration frequency, and the vibration phase of the vibration source, and to continue the subsequent vibration suppressing adjustments. When the vibration amplitude of the vibration source has not decreased, the factors causing the vibration of the vibration source may have disappeared at this time, and the detected vibration may be due to the vibration suppressing unit. At this time, whether the vibration amplitude, the vibration frequency, and the vibration phase of the vibration source are similar to the vibration amplitude, the vibration frequency, and the vibration phase of the vibration suppressing unit is determined (Step S414). When the vibration amplitude, the vibration frequency, and the vibration phase of the vibration source are similar to the vibration amplitude, the vibration frequency, and the vibration phase of the vibration suppressing unit, the vibration suppressing unit is disabled for a predetermined time, and whether the vibration of the vibration source originates from the vibration suppressing unit is determined within the predetermined time (Step S416). When the vibration source is detected to have stopped vibrating within the predetermined time, this represents the detected vibration of the vibration source originates from the vibration suppressing unit, and the vibration suppressing unit is continually disabled at this time (Step S418). Moreover, the process returns to Step S402 to continue detecting the vibration amplitude, the vibration frequency, and the vibration phase of the vibration source. On the other hand, when the vibration of the vibration source is detected, this represents the vibration source is still in a vibrating state, and thus the process may directly return to Step S402 to continue detecting the vibration amplitude, the vibration frequency, and the vibration phase of the vibration source, and to continue the subsequent vibration suppressing adjustments.

Returning to Step S414, when the vibration amplitude, the vibration frequency, and the vibration phase of the vibration source are not similar to the vibration amplitude, the vibration frequency, and the vibration phase of the vibration suppressing unit, the vibration amplitude of the vibration suppressing unit may be too large, and therefore the vibration amplitude of the vibration suppressing unit may be decreased at this time (Step S420). Thereafter, the process returns to Step S402 to continue detecting the vibration amplitude, the vibration frequency, and the vibration phase of the vibration source, and to perform the next adjustments.

Figure 5:
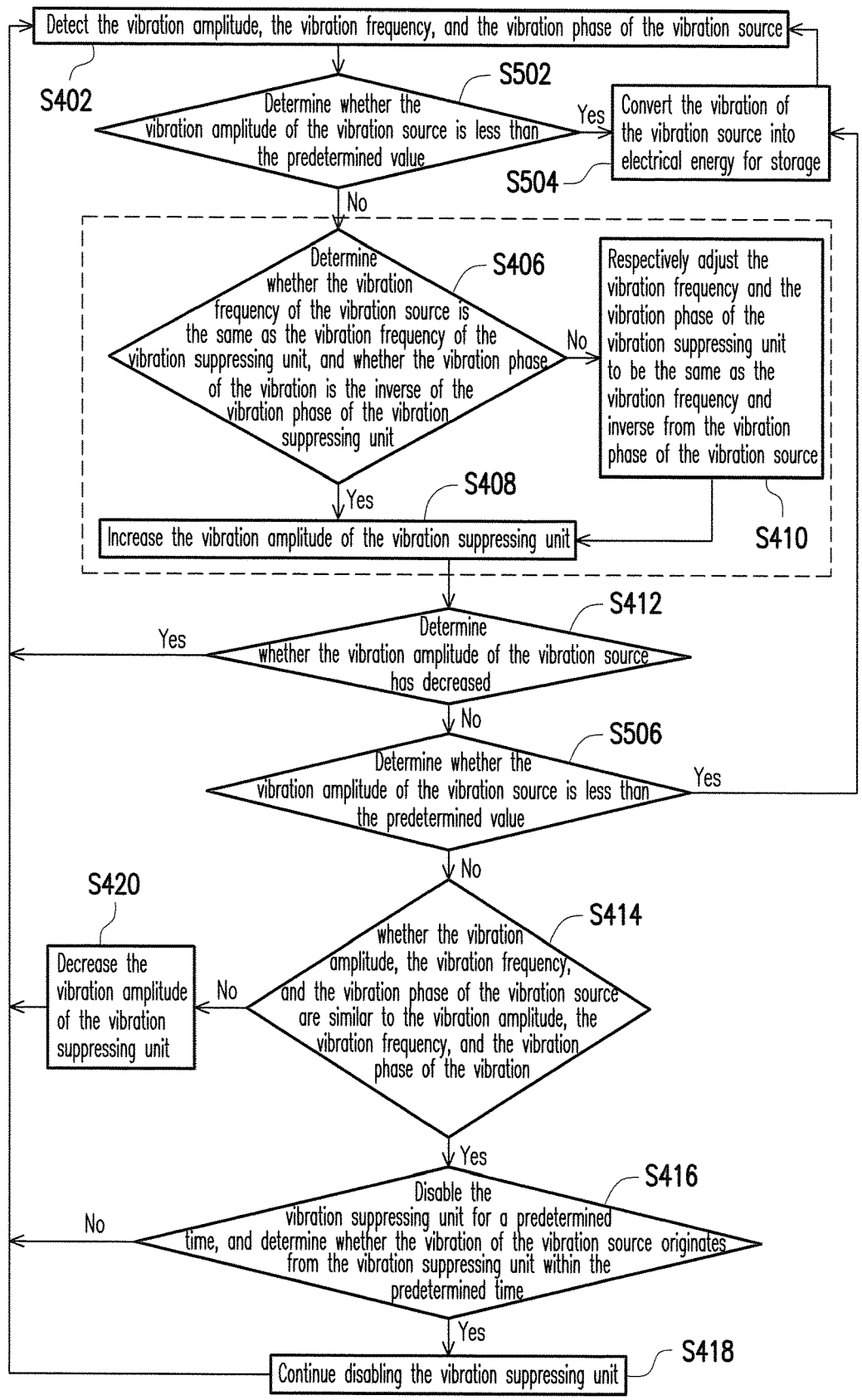
FIG. 5 is a flow diagram illustrating a vibration suppressing method of an electronic device according to another embodiment of the invention.

FIG. 5 is a flow diagram illustrating a vibration suppressing method of an electronic device according to another embodiment of the invention. Referring to FIG. 5, the vibration suppressing method of the electronic device in the present embodiment is different from the embodiment shown in FIG. 4 in that, the vibration suppressing method of the electronic device in the present embodiment further includes converting the vibration of the vibration source into an electrical energy for storage when the vibration amplitude of the vibration source is less than the predetei ined value. As shown in FIG. 5, after Step S402, whether the vibration amplitude of the vibration source is less than the predetermined value may be determined (Step S502). When the vibration amplitude of the vibration source is less than the predetermined value, the vibration of the vibration source is converted into electrical energy for storage (Step S504), and the process returns to Step S402 to continue detecting the vibration amplitude, the vibration frequency, and the vibration phase of the vibration source. On the other hand, when the vibration amplitude of the vibration source is not less than the predetermined value, then the process proceeds to Step 404, in which the vibration amplitude, the vibration frequency, and the vibration phase of the vibration suppressing unit are adjusted according to the vibration amplitude, the vibration frequency, and the vibration phase of the vibration source. Moreover, after Step S412, whether the vibration amplitude of the vibration source is less than the predetermined value may be determined (Step S506). When the vibration amplitude of the vibration source is less than the predetermined value, the vibration of the vibration source is converted into electrical energy for storage (Step S504). When the vibration amplitude of the vibration source is not less than the predetermined value, the process proceeds to Step S414, in which whether the vibration amplitude, the vibration frequency, and the vibration phase of the vibration source are similar to the vibration amplitude, the vibration frequency, and the vibration phase of the vibration suppressing unit are determined.

In view of the foregoing, according to embodiments of the invention, since the vibration amplitude, the vibration frequency, and the vibration phase of the vibration suppressing unit may be adjusted in real-time according to the vibration variation state of the vibration source, therefore, the vibration of the vibration source can be effectively suppressed, and thereby enhance the comfort when the user utilizes the electronic device. In some embodiments, the vibration of the vibration source may be converted into electrical energy for storage, and thus enhancing the utilization efficiency of the power source.

What is claimed is:

1. A vibration suppressing apparatus adapted for an electronic device, the vibration suppressing apparatus comprising:
    a sensing unit detecting a vibration amplitude, a vibration frequency, and a vibration phase of a vibration source of the electronic device, wherein the vibration source comprises at least one of a fan, a hard disk, a speaker and an optical drive;
    a vibration suppressing unit suppressing the vibration source when driven, the vibration suppressing unit having a vibration amplitude, a vibration frequency, and a vibration phase, wherein the vibration suppressing unit comprises at least one of a piezoelectric patch and a vibration motor; and
    a processor coupled to the sensing unit and the vibration suppressing unit, the processor driving the vibration suppressing unit and adjusting the vibration amplitude, the vibration frequency, and the vibration phase of the vibration suppressing unit according to the vibration amplitude, the vibration frequency, and the vibration phase of the vibration source,
    wherein the processor further determines whether the vibration amplitude of the vibration source has decreased, when the vibration amplitude of the vibration source has not decreased, whether the vibration amplitude, the vibration frequency, and the vibration phase of the vibration source are similar to the vibration amplitude, the vibration frequency, and the vibration phase of the vibration suppressing unit is determined, when the vibration amplitude, the vibration frequency, and the vibration phase of the vibration source are similar to the vibration amplitude, the vibration frequency, and the vibration phase of the vibration suppressing unit, the vibration suppressing unit is disabled for a predetermined time.

2. The vibration suppressing apparatus according to claim 1, wherein the processor further determines whether the vibration frequency of the vibration source is the same as the vibration frequency of the vibration suppressing unit, and whether the vibration phase of the vibration source is the inverse of the vibration phase of the vibration suppressing unit, when the vibration frequency and vibration phase of the vibration source are respectively not the same and not the inverse of the vibration frequency and vibration phase of the vibration suppressing unit, the vibration frequency and vibration phase of the vibration suppressing unit are respectively adjusted to be the same as the vibration frequency and inverse from the vibration phase of the vibration source, and when the vibration frequency of the vibration source is the same as the vibration frequency of the vibration suppressing unit, and the vibration phase of the vibration source is the inverse of the vibration phase of the vibration suppressing unit, then the vibration amplitude of the vibration suppressing unit is increased.

3. The vibration suppressing apparatus according to claim 1, wherein the processor further determines whether the vibration of the vibration source originates from the vibration suppressing unit is determined within the predetermined time, when the vibration amplitude, the vibration frequency, and the vibration phase of the vibration source are not similar to the vibration amplitude, the vibration frequency, and the vibration phase of the vibration suppressing unit, the vibration amplitude of the vibration suppressing unit is decreased.

4. The vibration suppressing apparatus according to claim 3, wherein when the sensing unit detects that the vibration of the vibration source has stopped within the predetermined time that the vibration suppressing unit is disabled, the processer determines whether the vibration of the vibration source originates from the vibration suppressing unit.

5. The vibration suppressing apparatus according to claim 1, further comprising:
a charge storage unit coupled to the processer, the sensing unit further converting the vibration of the vibration source into an electrical signal, and when the processer determines the vibration amplitude of the vibration source is less than a predetermined value, the processer stores an electrical energy generated by the sensing unit converting the vibration of the vibration source into the charge storage unit.

6. The vibration suppressing apparatus according to claim 3, further comprising:
a charge storage unit coupled to the processer, the sensing unit further converting the vibration of the vibration source into an electrical signal, when the processer determines the vibration amplitude of the vibration source has decreased, the processer further determines whether the vibration amplitude of the vibration source is less than a predetermined value according to the electrical signal, when the vibration amplitude of the vibration source is less than the predetermined value, the processer stores an electrical energy generated by the sensing unit converting the vibration of the vibration source into the charge storage unit, and when the vibration amplitude of the vibration source is not less than the predetermined value, the vibration amplitude, the vibration frequency, and the vibration phase of the vibration suppressing unit are adjusted according to the vibration amplitude, the vibration frequency, and the vibration phase of the vibration source.

7. The vibration suppressing apparatus according to claim 1, wherein the processer further derives and corrects the vibration amplitude, the vibration frequency, and the vibration phase of the vibration suppressing unit according to a timing difference between the vibration of the vibration source and when the detection result is generated by the sensing unit.

8. The vibration suppressing apparatus according to claim 1, further comprising:
an inverting amplifier coupled to the processer, the processer further outputting a vibration signal to the inverting amplifier according to the vibration of the vibration source, and the inverting amplifier outputting a vibration suppressing signal according to the vibration signal; and
a programmable resistor unit coupled to the inverting amplifier and the processer, the programmable resistor unit driving the vibration suppressing unit to suppress the vibration of the vibration source according to the vibration suppressing signal, wherein a resistance value of the programmable resistor unit is controlled by the processer.

9. The vibration suppressing apparatus according to claim 1, wherein the sensing unit is disposed on at least one of besides the vibration source and at a location where the body of a user contacts when the user utilizes the electronic device.

10. The vibration suppressing apparatus according to claim 1, wherein the vibration suppressing unit is disposed besides the vibration source or at a location where the body of the user contacts when the user utilizes the electronic device.

11. The vibration suppressing apparatus according to claim 1, wherein the sensing unit comprises a piezoelectric patch or a gravity sensor.

12. A vibration suppressing method of an electronic device, adapted for suppressing a vibration of a vibration source of the electronic device, the method comprising:
detecting a vibration amplitude, a vibration frequency, and a vibration phase of the vibration source, wherein the vibration source comprises at least one of a fan, a hard disk, a speaker and an optical drive;
according to the vibration amplitude, the vibration frequency, and the vibration phase of the vibration source, driving a vibration suppressing unit and adjusting a vibration amplitude, a vibration frequency, and a vibration phase of the vibration suppressing unit, so as to suppress the vibration of the vibration source, wherein the vibration suppressing unit comprises at least one of a piezoelectric patch and a vibration motor;
determining whether the vibration amplitude of the vibration source has decreased;
when the vibration amplitude of the vibration source has not decreased, determining whether the vibration amplitude, the vibration frequency, and the vibration phase of the vibration source are similar to the vibration amplitude, the vibration frequency, and the vibration phase of the vibration suppressing unit; and
when the vibration amplitude, the vibration frequency, and the vibration phase of the vibration source are similar to the vibration amplitude, the vibration frequency, and the vibration phase of the vibration suppressing unit, disabling the vibration suppressing unit for a predetermined time, and determining whether the vibration of the vibration source originates from the vibration suppressing unit within the predetermined time.

13. The vibration suppressing method according to claim 12, wherein the step of adjusting the vibration amplitude, the vibration frequency, and the vibration phase of the vibration suppressing unit according to the vibration amplitude, the vibration frequency, and the vibration phase of the vibration source comprises:
determining whether the vibration frequency of the vibration source is the same as the vibration frequency of the vibration suppressing unit, and whether the vibration phase of the vibration source is the inverse of the vibration phase of the vibration suppressing unit,
when the vibration frequency and the vibration phase of the vibration source are respectively different and not inverse from the vibration frequency and vibration phase of the vibration suppressing unit, respectively adjusting the vibration frequency and the vibration phase of the vibration suppressing unit to be the same as the vibration frequency and inverse from the vibration phase of the vibration source; and
when the vibration frequency of the vibration source is the same as the vibration frequency of the vibration suppressing unit, and the vibration phase of the vibration source is the inverse of the vibration phase of the vibration suppressing unit, increasing the vibration amplitude of the vibration suppressing unit.

14. The vibration suppressing method according to claim 12, further comprising:
   when the vibration amplitude, the vibration frequency, and the vibration phase of the vibration source are not similar to the vibration amplitude, the vibration frequency, and the vibration phase of the vibration suppressing unit, decreasing the vibration amplitude of the vibration suppressing unit.

15. The vibration suppressing method according to claim 14, wherein when the vibration of the vibration source has stopped within the predetermined time that the vibration suppressing unit is disabled, determining whether the vibration of the vibration source originates from the vibration suppressing unit.

16. The vibration suppressing method according to claim 14, further comprising:
   when the vibration amplitude of the vibration source decreased, determining whether the vibration amplitude of the vibration source is less than a predetermined value;
   when the vibration amplitude of the vibration source is less than the predetermined value, converting the vibration of the vibration source into an electrical energy for storage; and
   when the vibration amplitude of the vibration source is not less than the predetermined value, adjusting the vibration amplitude, the vibration frequency, and the vibration phase of the vibration suppressing unit according to the vibration amplitude, the vibration frequency, and the vibration phase of the vibration source.

17. The vibration suppressing method according to claim 12, further comprising:
   determining whether the vibration amplitude of the vibration source is less than a predetermined value;
   when the vibration amplitude of the vibration source is less than the predetermined value, converting the vibration of the vibration source into an electrical energy for storage; and
   when the vibration amplitude of the vibration source is not less than the predetermined value, adjusting the vibration amplitude, the vibration frequency, and the vibration phase of the vibration suppressing unit according to the vibration amplitude, the vibration frequency, and the vibration phase of the vibration source.

18. The vibration suppressing method according to claim 12, wherein the step of adjusting the vibration amplitude, the vibration frequency, and the vibration phase of the vibration suppressing unit according to the vibration amplitude, the vibration frequency, and the vibration phase of the vibration source further comprises:
   deriving and correcting the vibration amplitude, the vibration frequency, and the vibration phase of the vibration suppressing unit according to a timing difference between the vibration of the vibration source and when the detection result is generated.

* * * * *